(12) United States Patent
Zhang et al.

(10) Patent No.: US 9,143,169 B2
(45) Date of Patent: *Sep. 22, 2015

(54) PHYSICAL BROADCAST CHANNEL (PBCH) TRANSMISSION FOR RELIABLE DETECTION OF ANTENNA CONFIGURATION

(71) Applicant: Samsung Electronics Co., Ltd., Suwon-si, Gyeonggi-do (KR)

(72) Inventors: Jianzhong Zhang, Plano, TX (US); Zhouyue Pi, Allen, TX (US); Farooq Khan, Allen, TX (US); Joonyoung Cho, Kyeonggi (KR); Juho Lee, Suwon-si Gyeonggi-do (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/242,657

(22) Filed: Apr. 1, 2014

(65) Prior Publication Data

US 2014/0349697 A1 Nov. 27, 2014

Related U.S. Application Data

(63) Continuation of application No. 14/029,278, filed on Sep. 17, 2013, now Pat. No. 8,688,047, which is a continuation of application No. 12/291,274, filed on Nov. 7, 2008, now Pat. No. 8,538,335.

(60) Provisional application No. 60/996,857, filed on Dec. 7, 2007.

(51) Int. Cl.
*H04B 1/00* (2006.01)
*H04B 15/00* (2006.01)
(Continued)

(52) U.S. Cl.
CPC .............. *H04B 1/0053* (2013.01); *H03M 13/09* (2013.01); *H04B 1/40* (2013.01); *H04B 7/066* (2013.01);
(Continued)

(58) Field of Classification Search
CPC ............................ H03M 13/09; H04B 1/0053
USPC ................. 455/63.1, 101, 562.1, 509, 67.11, 455/414.1, 114.2, 63.4, 452.1, 517, 524; 370/329, 330, 328; 375/140, 146, 147
See application file for complete search history.

(56) References Cited

U.S. PATENT DOCUMENTS 6,934,317 B1 8/2005 Dent
7,558,540 B2 7/2009 Jin et al.
(Continued)

FOREIGN PATENT DOCUMENTS

JP 2001111614 A 4/2001
JP 2005341442 A 12/2005
(Continued)

OTHER PUBLICATIONS

3GPP TSG RAN 1 Meeting #51; "The Reliability Improvement of the Blind Detection of the Antenna Configuration"; R1-074642; Jeju Island, South Korea; Nov. 5-9, 2007; 4 pages.
(Continued)

*Primary Examiner* — John J Lee

(57) ABSTRACT

Reliable detection of the configuration of transmit antennas includes obtaining a data for transmission, encoding the data, and modulating the data. During the modulating of the data, the data may be configured in such a way as to convey the configuration of the antennas through the modulation of the data. An antenna configuration is obtained by obtaining a representation of the antenna configuration, and masking the data with an error correcting code, where the mask corresponds to the antenna configuration.

28 Claims, 12 Drawing Sheets

(51) Int. Cl.

| | | |
|---|---|---|
| *H04B 7/06* | (2006.01) | |
| *H04L 1/00* | (2006.01) | |
| *H04L 27/18* | (2006.01) | |
| *H04L 27/34* | (2006.01) | |
| *H04B 1/40* | (2015.01) | |
| *H03M 13/09* | (2006.01) | |
| *H04L 27/26* | (2006.01) | |
| *H04L 5/00* | (2006.01) | |
| *H04W 4/06* | (2009.01) | |
| *H04W 28/04* | (2009.01) | |
| *H04W 84/04* | (2009.01) | |
| *H04W 88/08* | (2009.01) | |

(52) U.S. Cl.
CPC ............ *H04L 1/0023* (2013.01); *H04L 1/0028* (2013.01); *H04L 27/18* (2013.01); *H04L 27/2627* (2013.01); *H04L 27/34* (2013.01); *H04L 5/0007* (2013.01); *H04W 4/06* (2013.01); *H04W 28/04* (2013.01); *H04W 84/042* (2013.01); *H04W 88/08* (2013.01)

(56) References Cited

U.S. PATENT DOCUMENTS

| | | | |
|---|---|---|---|
| 8,498,259 B2* | 7/2013 | Suzuki et al. | 370/329 |
| 2005/0265472 A1 | 12/2005 | Takeda et al. | |
| 2007/0135161 A1 | 6/2007 | Molnar et al. | |
| 2009/0036051 A1 | 2/2009 | Horiuchi et al. | |
| 2010/0323637 A1* | 12/2010 | Roman et al. | 455/101 |
| 2012/0147773 A1* | 6/2012 | Kim et al. | 370/252 |
| 2013/0044706 A1* | 2/2013 | Suzuki et al. | 370/329 |

FOREIGN PATENT DOCUMENTS

| | | |
|---|---|---|
| JP | 2006333088 A | 12/2006 |
| KR | 20050073610 A | 7/2005 |
| WO | WO 2007/102344 A1 | 9/2007 |

OTHER PUBLICATIONS

3GPP TSG RAN 1 Meeting #50-bis; "Discussion on the Improvement of the Blind Detection of the Antenna Configuration"; R1-073970; Shanghai, China; Oct. 8-12, 2007; 9 pages.

Extended European Search Report dated Jan. 19, 2015 in connection with European Patent Application No. 08857924.8.

* cited by examiner

PHYSICAL BROADCAST CHANNEL (PBCH) TRANSMISSION FOR RELIABLE DETECTION OF ANTENNA CONFIGURATION

CROSS-REFERENCE TO RELATED APPLICATION(S) AND CLAIM OF PRIORITY

The present application is a continuation of U.S. Non-Provisional patent application Ser. No. 14/029,278 filed Sep. 17, 2013, now U.S. Pat. No. 8,688,047, which is a continuation of U.S. Non-Provisional patent application Ser. No. 12/291,274 filed Nov. 7, 2008, now U.S. Pat. No. 8,538,335, both of which are incorporated herein by reference, and claims priority to U.S. Provisional Patent Application No. 60/996,857 filed Dec. 7, 2007, which is also incorporated herein by reference.

TECHNICAL FIELD

The present application relates generally to wireless communications and, more specifically, to a technique for reliable detection of antenna configuration.

BACKGROUND

Modern communication systems include transceivers that comprise a plurality of antennas arranged in a plurality of configurations. In order to convey information using these transceivers, information relating to the configuration of the antennas needs to be communicated to the device communicating with the transceiver. However, this communication requires considerable bandwidth and is not easily done. The conveyance of the configuration of the antennas represents significant overhead to a communication system. Therefore, there is a need in the art for an improved system and method for conveying antenna configuration information.

SUMMARY

In one embodiment, systems and methods for transmitting data related to the configuration of transmit antennas are disclosed. These methods may include obtaining a data for transmission, encoding the data and modulating the data. During the modulating of the data, the data may be configured in such a way as to convey the configuration of the antennas through the modulation of the data. These methods may also include obtaining an antenna configuration, obtaining a representation of the antenna configuration, and masking the data with an error correcting code, where the mask corresponds to the antenna configuration.

In another embodiment, a wireless communication network is disclosed that comprises a plurality of base stations capable of wireless communication with a plurality of subscriber stations within a coverage area of the network. In these embodiments at least one of the plurality of base stations is capable of encoding a transmission antenna configuration into a QPSK constellation and transmitting the QPSK constellation. In addition, the transmission may be masked with an error correction code that corresponds to a transmit antenna configuration.

In yet another embodiment, systems and methods are disclosed with a base station capable of wireless communication with a plurality of subscriber stations within a coverage area of a network. In these embodiments, the base station is capable of transmitting data with at least one antenna, encoding a configuration of the at least one antenna into a datastream, and transmitting the data stream. These methods may further comprise transmitting an error correction code that has been masked to represent the configuration of the transmit antennas.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 12, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication system.

Figure 1:
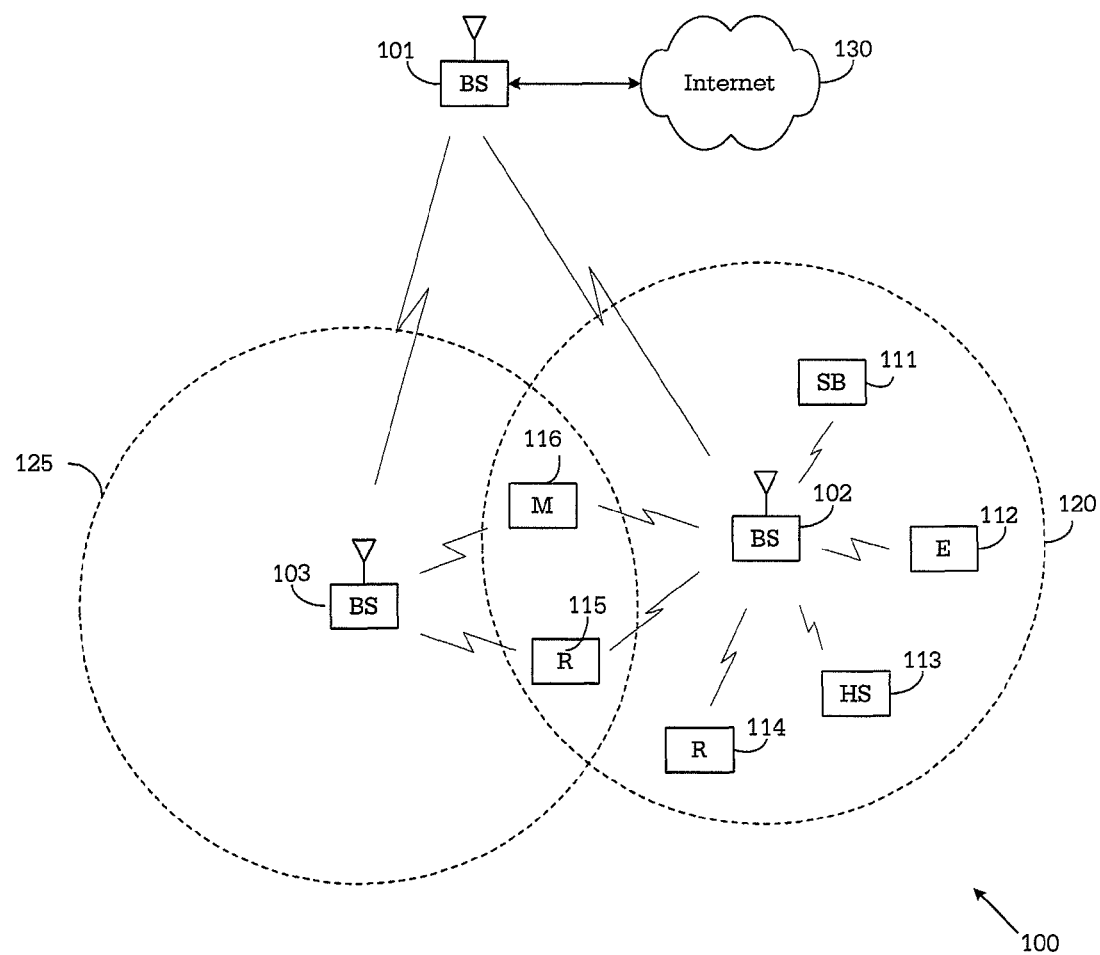
FIG. 1 illustrates an exemplary wireless network that transmits ACK/NACK messages in the uplink according to the principles of the present disclosure.

FIG. 1 illustrates exemplary wireless network 100, which transmits ACK/NACK messages according to the principles of the present disclosure. In the illustrated embodiment, wireless network 100 includes base station (BS) 101, base station (BS) 102, base station (BS) 103, and other similar base stations (not shown). Base station 101 is in communication with base station 102 and base station 103. Base station 101 is also in communication with Internet 130 or a similar IP-based network (not shown).

Base station 102 provides wireless broadband access (via base station 101) to Internet 130 to a first plurality of subscriber stations within coverage area 120 of base station 102. The first plurality of subscriber stations includes subscriber station 111, which may be located in a small business (SB), subscriber station 112, which may be located in an enterprise (E), subscriber station 113, which may be located in a WiFi hotspot (HS), subscriber station 114, which may be located in a first residence (R), subscriber station 115, which may be located in a second residence (R), and subscriber station 116, which may be a mobile device (M), such as a cell phone, a wireless laptop, a wireless PDA, or the like.

Base station 103 provides wireless broadband access (via base station 101) to Internet 130 to a second plurality of subscriber stations within coverage area 125 of base station 103. The second plurality of subscriber stations includes subscriber station 115 and subscriber station 116. In an exemplary embodiment, base stations 101-103 may communicate with each other and with subscriber stations 111-116 using OFDM or OFDMA techniques.

Base station 101 may be in communication with either a greater number or a lesser number of base stations. Furthermore, while only six subscriber stations are depicted in FIG. 1, it is understood that wireless network 100 may provide wireless broadband access to additional subscriber stations. It is noted that subscriber station 115 and subscriber station 116 are located on the edges of both coverage area 120 and coverage area 125. Subscriber station 115 and subscriber station 116 each communicate with both base station 102 and base station 103 and may be said to be operating in handoff mode, as known to those of skill in the art.

Subscriber stations 111-116 may access voice, data, video, video conferencing, and/or other broadband services via Internet 130. In an exemplary embodiment, one or more of subscriber stations 111-116 may be associated with an access point (AP) of a WiFi WLAN. Subscriber station 116 may be any of a number of mobile devices, including a wireless-enabled laptop computer, personal data assistant, notebook, handheld device, or other wireless-enabled device. Subscriber stations 114 and 115 may be, for example, a wireless-enabled personal computer (PC), a laptop computer, a gateway, or another device.

Figure 2A:
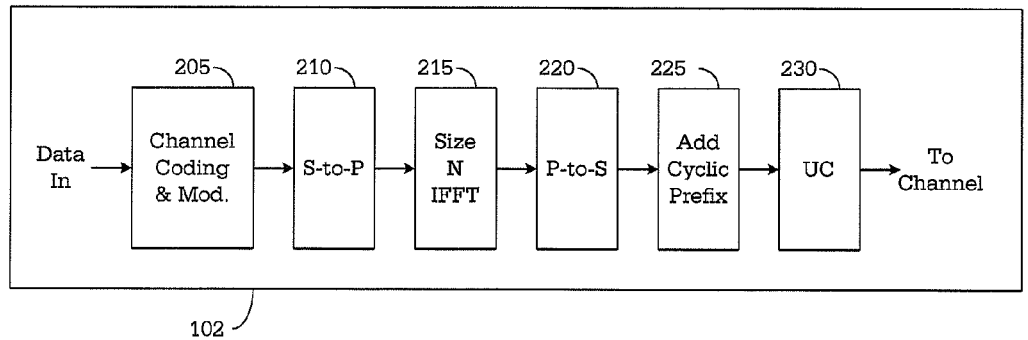
FIG. 2A is a high-level diagram of an OFDMA transmitter according to one embodiment of the present disclosure.
Figure 2B:
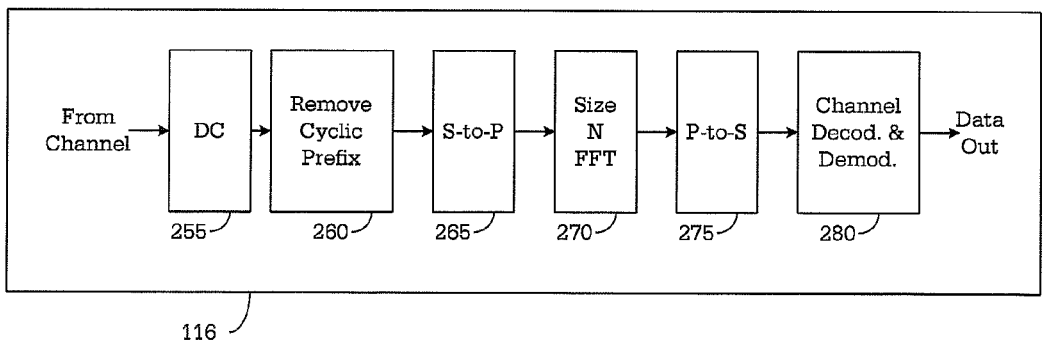
FIG. 2B is a high-level diagram of an OFDMA receiver according to one embodiment of the present disclosure.

FIG. 2A is a high-level diagram of an orthogonal frequency division multiple access (OFDMA) transmit path. FIG. 2B is a high-level diagram of an orthogonal frequency division multiple access (OFDMA) receive path. In FIGS. 2A and 2B, the OFDMA transmit path is implemented in base station (BS) 102 and the OFDMA receive path is implemented in subscriber station (SS) 116 for the purposes of illustration and explanation only. However, it will be understood by those skilled in the art that the OFDMA receive path may also be implemented in BS 102 and the OFDMA transmit path may be implemented in SS 116.

The transmit path in BS 102 comprises channel coding and modulation block 205, serial-to-parallel (S-to-P) block 210, Size N Inverse Fast Fourier Transform (IFFT) block 215, parallel-to-serial (P-to-S) block 220, add cyclic prefix block 225, up-converter (UC) 230. The receive path in SS 116 comprises down-converter (DC) 255, remove cyclic prefix block 260, serial-to-parallel (S-to-P) block 265, Size N Fast Fourier Transform (FFT) block 270, parallel-to-serial (P-to-S) block 275, channel decoding and demodulation block 280.

At least some of the components in FIGS. 2A and 2B may be implemented in software while other components may be implemented by configurable hardware or a mixture of software and configurable hardware. In particular, it is noted that the FFT blocks and the IFFT blocks described in this disclosure document may be implemented as configurable software algorithms, where the value of Size N may be modified according to the implementation.

Furthermore, although this disclosure is directed to an embodiment that implements the Fast Fourier Transform and the Inverse Fast Fourier Transform, this is by way of illustration only and should not be construed to limit the scope of the disclosure. It will be appreciated that in an alternate embodiment of the disclosure, the Fast Fourier Transform functions and the Inverse Fast Fourier Transform functions may easily be replaced by Discrete Fourier Transform (DFT) functions and Inverse Discrete Fourier Transform (IDFT) functions, respectively. It will be appreciated that for DFT and IDFT functions, the value of the N variable may be any integer number (i.e., 1, 2, 3, 4, etc.), while for FFT and IFFT functions, the value of the N variable may be any integer number that is a power of two (i.e., 1, 2, 4, 8, 16, etc.).

In BS 102, channel coding and modulation block 205 receives a set of information bits, applies coding (e.g., Turbo coding) and modulates (e.g., QPSK, QAM) the input bits to produce a sequence of frequency-domain modulation symbols. Serial-to-parallel block 210 converts (i.e., de-multiplexes) the serial modulated symbols to parallel data to produce N parallel symbol streams where N is the IFFT/FFT size used in BS 102 and SS 116. Size N IFFT block 215 then performs an IFFT operation on the N parallel symbol streams to produce time-domain output signals. Parallel-to-serial block 220 converts (i.e., multiplexes) the parallel time-domain output symbols from Size N IFFT block 215 to produce a serial time-domain signal. Add cyclic prefix block 225 then inserts a cyclic prefix to the time-domain signal. Finally, up-converter 230 modulates (i.e., up-converts) the output of add cyclic prefix block 225 to RF frequency for transmission via a wireless channel. The signal may also be filtered at baseband before conversion to RF frequency.

The transmitted RF signal arrives at SS 116 after passing through the wireless channel and reverse operations to those at BS 102 are performed. Down-converter 255 down-converts the received signal to baseband frequency and remove cyclic prefix block 260 removes the cyclic prefix to produce the serial time-domain baseband signal. Serial-to-parallel block 265 converts the time-domain baseband signal to parallel time domain signals. Size N FFT block 270 then performs an FFT algorithm to produce N parallel frequency-domain signals. Parallel-to-serial block 275 converts the parallel frequency-domain signals to a sequence of modulated data symbols. Channel decoding and demodulation block 280 demodulates and then decodes the modulated symbols to recover the original input data stream.

Each of base stations 101-103 may implement a transmit path that is analogous to transmitting in the downlink to subscriber stations 111-116 and may implement a receive path that is analogous to receiving in the uplink from subscriber stations 111-116. Similarly, each one of subscriber stations 111-116 may implement a transmit path corresponding to the architecture for transmitting in the uplink to base stations 101-103 and may implement a receive path corresponding to the architecture for receiving in the downlink from base stations 101-103.

The present disclosure describes methods and systems to convey information relating to base station configuration to subscriber stations and, more specifically, to relaying base station antenna configuration to subscriber stations. This information can be conveyed through a plurality of methods, including placing antenna configuration into a quadrature-phase shift keying (QPSK) constellation (e.g., n-quadrature amplitude modulation (QAM) signal, wherein n is $2^x$) and placing antenna configuration into the error correction data (e.g., cyclic redundancy check (CRC) data). By encoding antenna information into either the QPSK constellation or the error correction data, the base stations 101-103 can convey base stations 101-103 antenna configuration without having to separately transmit antenna configuration. These systems and methods allow for the reduction of overhead while ensuring reliable communication between base stations 101-103 and a plurality of subscriber stations.

In some embodiments disclosed herein, data is transmitted using QAM. QAM is a modulation scheme which conveys data by modulating the amplitude of two carrier waves. These two waves are referred to as quadrature carriers, and are generally out of phase with each other by 90 degrees. QAM may be represented by a constellation that comprises $2^x$ points, where x is an integer greater than 1. In the embodiments discussed herein, the constellations discussed will be four point constellations (4-QAM). In a 4-QAM constellation a 2 dimensional graph is represented with one point in each quadrant of the 2 dimensional graph. However, it is explicitly understood that the innovations discussed herein may be used with any modulation scheme with any number of points in the constellation. It is further understood that with constellations with more than four points additional information (e.g., reference power signal) relating to the configuration of the base stations 101-103 may be conveyed consistent with the disclosed systems and methods.

It is understood that the transmitter within base stations 101-103 performs a plurality of functions prior to actually transmitting data. In the 4-QAM embodiment, QAM modulated symbols are serial-to-parallel converted and input to an inverse fast Fourier transform (IFFT). At the output of the IFFT, N time-domain samples are obtained. In the disclosed embodiments, N refers to the IFFT/fast Fourier transform (FFT) size used by the OFDM system. The signal after IFFT is parallel-to-serial converted and a cyclic prefix (CP) is added to the signal sequence. The resulting sequence of samples is referred to as an OFDM symbol.

At the receiver within the subscriber station, this process is reversed, and the cyclic prefix is first removed. Then the signal is serial-to-parallel converted before being fed into the FFT. The output of the FFT is parallel-to-serial converted, and the resulting QAM modulation symbols are input to the QAM demodulator.

The total bandwidth in an OFDM system is divided into narrowband frequency units called subcarriers. The number of subcarriers is equal to the FFT/IFFT size N used in the system. In general, the number of subcarriers used for data is less than N because some subcarriers at the edge of the frequency spectrum are reserved as guard subcarriers. In general, no information is transmitted on guard subcarriers.

Figure 3:
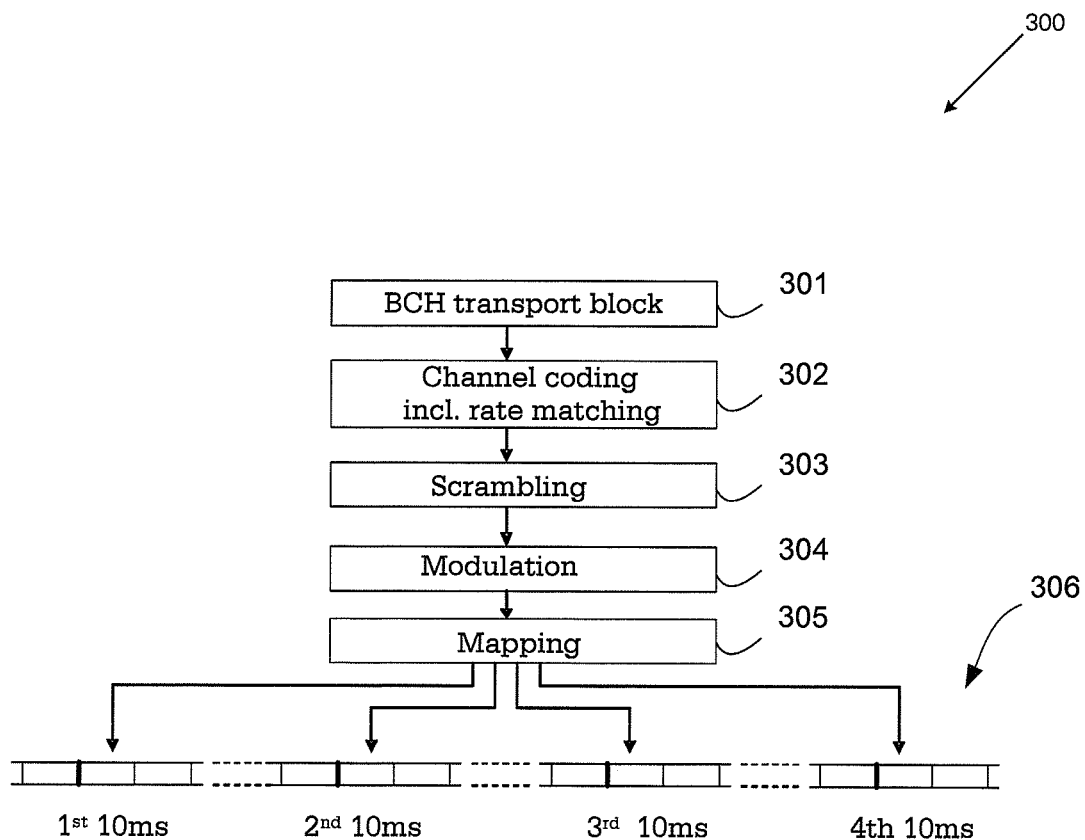
FIG. 3 is a high-level diagram of a transmission chain according to one embodiment of the present disclosure.
Figure 6:
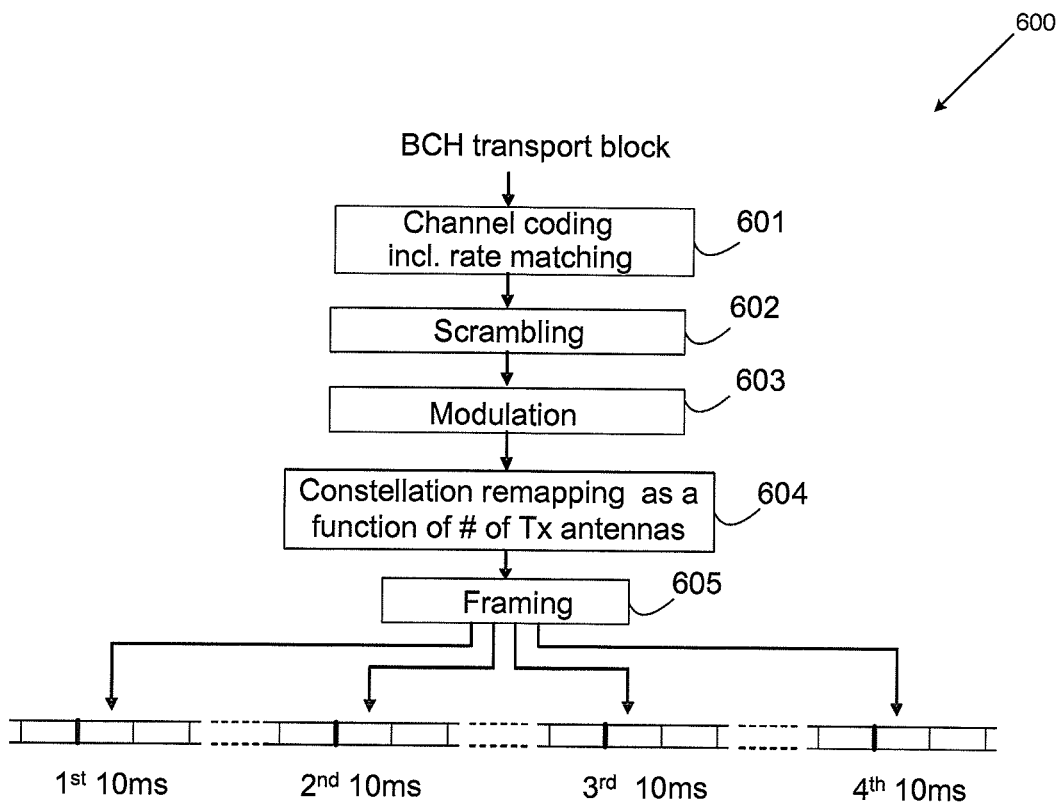
FIG. 6 is an example of a transport chain illustrating constellation remapping according to one embodiment of the present disclosure.
Figure 8:
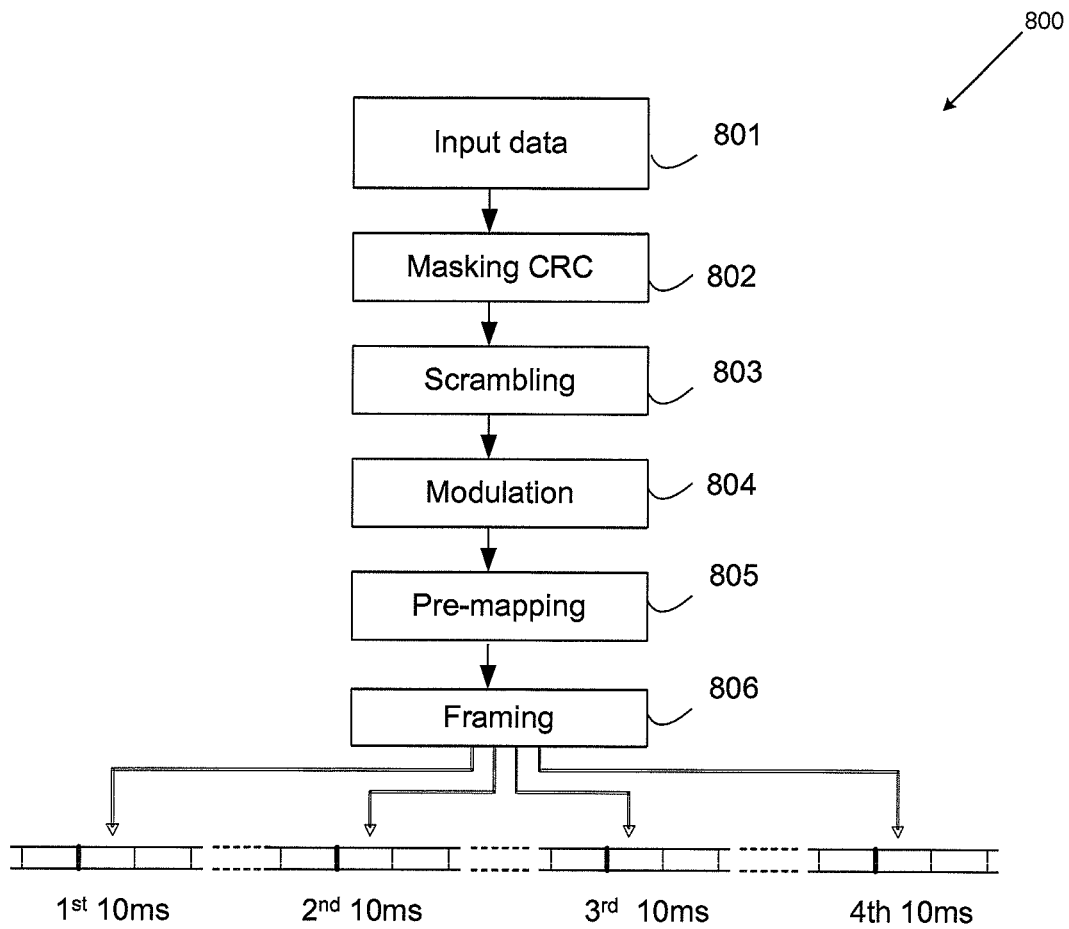
FIG. 8 is a block diagram of the mapping of constellations and CRC masking according to one embodiment of the present disclosure.

In the examples illustrated by FIGS. 3, 6, and 8, the coded BCH transport block is mapped to four subframes (subframes #0, #1, #2, and #3) within a 40 ms interval. In the embodiment of 4-QAM, the coded broadcast channel (BCH) transport block is mapped to 4 OFDM symbols within a subframe. In case of extended CP, this implies a restriction in the number of idle symbols in the case of TDD FS type 1 to three idle symbols.

For exemplary purposes, three base stations 101-103 antenna configurations will be used as examples herein. These configurations are one transmission antenna, two transmission antennas using a space frequency block coding (SFBC) transmission scheme, and four transmission antennas using SFBC—frequency switching transmission diversity (FSTD) transmission scheme. While different transmissions schemes are used, detecting the number of transmission antennas based upon the schemes is difficult. Each transmission scheme has a large portion of the signal which can be considered as a subset of the other schemes, and therefore it is difficult to reliably detect and determine the scheme being used based upon the signal. Therefore, the antenna configuration will need to be encoded either into the physical broadcast channel (P-BCH) transport block and related QAM constellation or the error correction data of the P-BCH transport block.

QPSK modulation is used for P-BCH. As discussed before, the 4-QAM constellation comprises four separate points that are distributed into the four quadrants of a two-dimensional mapping. The following TABLE 1 illustrates the constellation mapping that will be discussed in the present disclosure:

TABLE 1

| Constellation Mapping | | |
|---|---|---|
| b(i), b(i + 1) | I | Q |
| 00 | $1/\sqrt{2}$ | $1/\sqrt{2}$ |
| 01 | $1/\sqrt{2}$ | $-1/\sqrt{2}$ |
| 10 | $-1/\sqrt{2}$ | $1/\sqrt{2}$ |
| 11 | $-1/\sqrt{2}$ | $-1/\sqrt{2}$ |

The placing of data into the outgoing transmission of the base stations 101-103 is performed through a transmission chain. A transmission chain is a series of operations performed to prepare data for transmission. These operations may include scrambling, modulating, and mapping data. Transmission chains may be used consistent with a plurality of communication techniques, including orthogonal frequency division multiplexing (OFDM).

In order to facilitate understanding of the numerous embodiments of transmitting base stations 101-103 antenna configuration information, a transmission chain of broadcast channel (BCH) mapped data across a predetermined time interval is illustrated by FIG. 3. It is understood that the examples disclosed relating to the encoding of data disclosed herein range from 10 ms-40 ms, but that any time interval may be used consistent with the disclosed systems and methods.

FIG. 3 is an example of a method that may be used consistent with this disclosure to encode data. FIG. 3 is a high level description of the transmission of a BCH transport block. The P-BCH is received by the mapping mechanism in a BCH transport block (Block 301). Channel coding which includes rate matching is applied to the BCH transport block (Block 302). As will be discussed herein during channel coding, the data may be modified to embed error correcting information into the data from the BCH transport block that can be used to convey antenna configuration. The encoded and rate matched data is scrambled (Block 303) and modulated (Block 304). The resulting modulated data is mapped onto the QSPK data stream into frames (Block 305). In some embodiments during the mapping of data the map will be altered to convey antenna configuration information. It is understood that this transmit chain is provided for exemplary purposes only, and that other transmit chains, in various orders with various steps, may be used consistent with the present disclosure.

Figure 4:
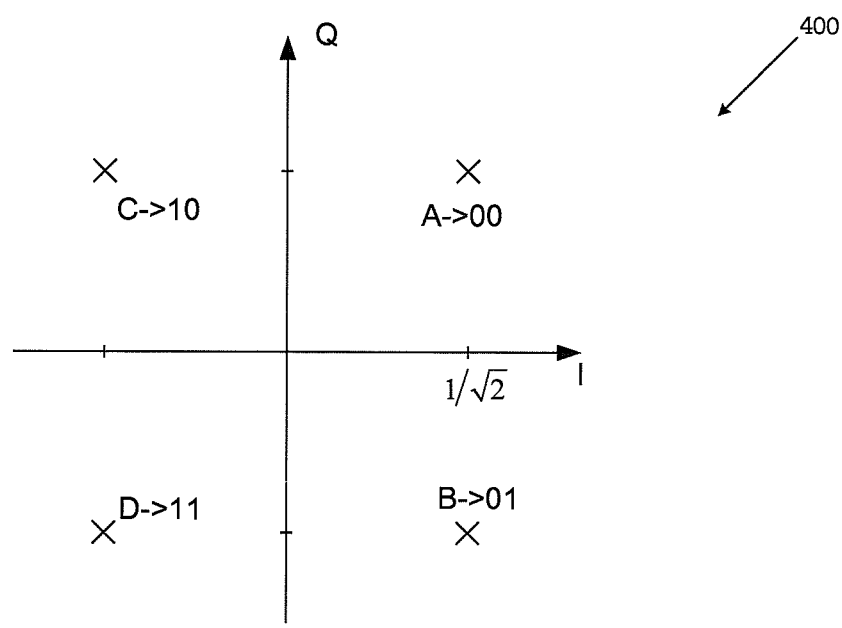
FIG. 4 is a diagram of a constellation mapping of QPSK modulation according to one embodiment of the present disclosure.

FIG. 4 is a two-dimensional constellation mapping of QPSK modulation using the data shown in TABLE 1. As was discussed above in each frame encoded by the transmit chain, there are four items that are mapped onto the QSPK data stream. For example purposes, these four information elements will be referred to as 00 (in quadrant A), 01 (in quadrant B), 10 (in quadrant C), and 11 (in quadrant D). It is understood that the QPSK constellation mapping can provide information relating to the configuration of the antennas within the base stations 101-103. In general, since there are 4 constellation points in a QPSK modulation, there are a total of 4! (24) total possible mappings as shown in below. The following TABLE 2 identifies available mappings:

TABLE 2

QPSK Mappings

| mapping index # | 00 | 01 | 10 | 11 |
|---|---|---|---|---|
| 1 | A | B | C | D |
| 2 | A | B | D | C |
| 3 | A | C | B | D |
| 4 | A | C | D | B |
| 5 | A | D | B | C |
| 6 | A | D | C | B |
| 7 | B | A | C | D |
| 8 | B | A | D | C |
| 9 | B | C | A | D |
| 10 | B | C | D | A |
| 11 | B | D | A | C |
| 12 | B | D | C | A |
| 13 | C | A | B | D |
| 14 | C | A | D | B |
| 15 | C | B | A | D |
| 16 | C | B | D | A |
| 17 | C | D | A | B |
| 18 | C | D | B | A |
| 19 | D | A | B | C |
| 20 | D | A | C | B |
| 21 | D | B | A | C |
| 22 | D | B | C | A |
| 23 | D | C | A | B |
| 24 | D | C | B | A |

FIG. 4 is an example of mapping index #14 shown in TABLE 2. In this mapping, A, B, C, and D are quadrants of the QPSK constellation. The mapping of elements 00, 01, 10, and 11 into quadrants A, B, C, and D can be detected by the subscriber station. This mapping is then compared to a known table, such as TABLE 3.

TABLE 3

QPSK Mappings with Antenna Configuration

| mapping index # | 00 | 01 | 10 | 11 | Configuration |
|---|---|---|---|---|---|
| 1 | A | B | C | D | 1 |
| 2 | A | B | D | C | 1 |
| 3 | A | C | B | D | 1 |
| 4 | A | C | D | B | 2 SFBC |
| 5 | A | D | B | C | 2 SFBC |
| 6 | A | D | C | B | 2 SFBC |
| 7 | B | A | C | D | 2 SFBC |
| 8 | B | A | D | C | 4 SFBC/FSTD |
| 9 | B | C | A | D | 3 SFBC/FSTD |
| 10 | B | C | D | A | 3 SFBC/FSTD |
| 11 | B | D | A | C | 4 SFBC/FSTD |
| 12 | B | D | C | A | 3 SFBC/FSTD |
| 13 | C | A | B | D | 3 SFBC/FSTD |
| 14 | C | A | D | B | 2 SFBC |
| 15 | C | B | A | D | 3 SFBC/FSTD |
| 16 | C | B | D | A | 3 SFBC/FSTD |
| 17 | C | D | A | B | 2 SFBC |
| 18 | C | D | B | A | 3 SFBC/FSTD |
| 19 | D | A | B | C | 3 SFBC/FSTD |
| 20 | D | A | C | B | 3 SFBC/FSTD |
| 21 | D | B | A | C | 3 SFBC/FSTD |
| 22 | D | B | C | A | 3 SFBC/FSTD |
| 23 | D | C | A | B | 3 SFBC/FSTD |
| 24 | D | C | B | A | 3 SFBC/FSTD |

Using TABLE 3, the antenna configuration of the base stations 101-103 transmitting the constellation illustrated by FIG. 4 can be determined. The antenna configuration can be determined through the QPSK mapping and is independent of the transmission scheme and the number of antennas used. Therefore, the use of a constellation mapping coupled with a known QPSK table, such as the one illustrated by TABLE 3, offers a reliable method for determining the antenna configuration of the base stations 101-103.

Figure 5A:
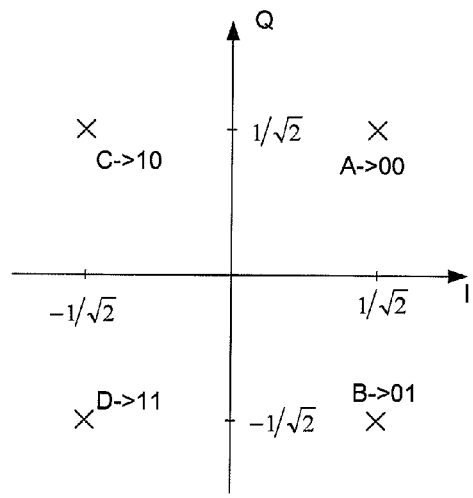
FIG. 5A is a diagram of a modified constellation mapping of QPSK modulation according to one embodiment of the present disclosure.

FIG. 4 is one example of a QPSK mapping, and FIGS. 5A, 5B, 5C, and 5D are examples of various other mappings. FIG. 5A is an example of mapping #1 in TABLE 2, and is substantially similar to FIG. 4 with the addition of illustrating the position of each mapping relative to $1/\sqrt{2}$.

Figure 5B:
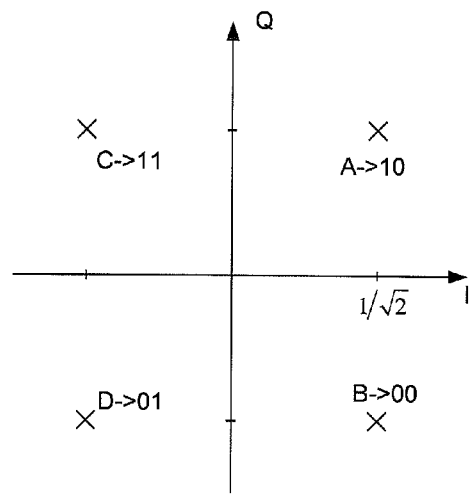
FIG. 5B is a diagram of a second modified constellation mapping of QPSK modulation according to one embodiment of the present disclosure.
Figure 5C:
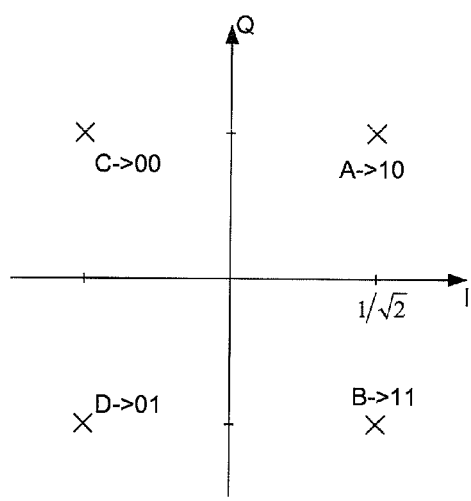
FIG. 5C is a diagram of a third modified constellation mapping of QPSK modulation according to one embodiment of the present disclosure.
Figure 5D:
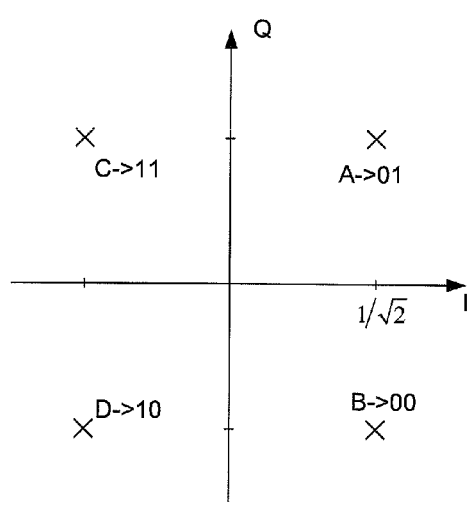
FIG. 5D is a diagram of a fourth modified constellation mapping of QPSK modulation according to one embodiment of the present disclosure.

FIGS. 5B, 5C, and 5D are examples of mappings that are performed upon FIG. 5A. The purpose of these mappings is to add antenna configuration data to the QPSK mapping of data. This addition of data may be performed through mapping, shifting, or negation as illustrated by FIGS. 5B, 5C, and 5D. It is explicitly understood that any method of adjusting the QPSK constellation may be used.

FIG. 5B is a 90 degree phase shift of the data in FIG. 5A. Through the phase shift of FIG. 5A, the antenna configuration relating to mapping index #11 of TABLE 3 can be conveyed. Through this mapping, the configuration of 4 SFBC/FSTD is determined.

FIG. 5C is an example of a negation mapping. FIG. 5C is a negation on the I-part after mapping index #1. Through the negation, the antenna configuration relating to mapping index #17 of TABLE 3 can be conveyed. Through this mapping, the configuration of 3 SFBC/FSTD is determined.

FIG. 5D is another example of a negation mapping. FIG. 5C is a negation on the Q-part after mapping index #1. Through the negation, the antenna configuration relating to mapping index #8 of TABLE 3 can be conveyed. Through this mapping, the configuration of 3 SFBC/FSTD is determined.

FIG. 6 is an example of a transport chain 600 illustrating constellation remapping. In the embodiment shown in FIG. 6, a channel rate coding including rate matching is performed (Block 601). In addition, the channel rate signal is scrambled (Block 602). Next, the scrambled signal is modulated (Block 603). After the signal has been modulated, constellation remapping is performed (Block 604). The remapping of the constellation is done so that the resulting mapping will convey the antenna configuration of the base stations 101-103. The constellation remapping is performed by first identifying the base stations 101-103 antenna configuration. After the antenna configuration is determined, a mapping that corresponds to the antenna configuration is selected. Using the selected mapping configuration, QPSK remapping is performed to convey the antenna configuration. Finally, data framing is performed where data is placed onto frames for transmission (Block 605).

It is understood that in the modulation step (Block 603), mapping index #1 in TABLE 3 is used. After the constellation remapping step, the overall mapping from the scrambled bits $\tilde{b}(0), \ldots, \tilde{b}(M_{bit}-1)$ to the output of the constellation remapping step $\tilde{d}(0), \ldots, \tilde{d}(M_{symb}-1)$ can be described as a mapping in TABLE 3 whose index is a function $f(N_t)$, where $N_t$ is the number of transmission antennas in the base stations 101-103.

In case when there are 3 possible antenna configurations with 1, 2, or 4 transmit antennas, the modulation step and constellation remapping step are defined by 3 (out of 24) possible mappings in TABLE 3. For example, the following function shows the mapping that corresponds to the number of antennas in a given configuration:

$$f(N_t) = \begin{cases} m\#1, & N_t = 1 \\ m\#14, & N_t = 2 \\ m\#11, & N_t = 4 \end{cases}$$

Note that the notation m#1 is used to denote the first mapping in TABLE 3. The remapping (Block 604) will depend upon the antenna configuration. For the single transmit antenna configuration case, the constellation remapping step is simply $\tilde{d}(i)=d(i)$ for $i=0, M_{symb}-1$.

In the case where there are two transmit antennas, as shown in FIG. 4, the mapping index #14 of TABLE 3 can be viewed by applying a 90 degree shift at the output of the modulation step. For the sequence at the output of the modulation step, $d(0), \ldots, d(M_{symb}-1), d(i)=d_1(i)+jd_Q(i)$ for $i=0, \ldots M_{symb}-1$, and are real and imaginary parts of d(i). Then the output of the constellation remapping step gives a symbol sequence described by:

$$\tilde{d}(i)=j\cdot d(i)=jd_1(i)-d_Q(i) \text{ for } i=0, \ldots M_{symb}-1$$

As shown in this equation, the 90 degree phase shift simply translates into an I-Q switch with a negation operation.

In the case that there are four transmit antennas, a -90 degree shift can be applied at the output of the modulation step on top of mapping #1. For the sequence at the output of the modulation step $d(0), \ldots, d(M_{symb}-1)$, if we denote $d(i)=d_1(i)+jd_Q(i)$ for $i=0, \ldots M_{symb}-1$, and $d_1(i),d_Q(i)$ are denoted as the real and imaginary parts of d(i), then the output of the constellation remapping step gives a symbol sequence described by $\tilde{d}(i)=-j\cdot d(i)=-jd_1(i)+d_Q(i)$ for $i=0, \ldots M_{symb}-1$. This -90 degree phase shift also translates into an I-Q switch with a negation operation.

For another example of this embodiment, the following function in the constellation remapping is described:

$$f(N_t) = \begin{cases} m\#1, & N_t = 1 \\ m\#17, & N_t = 2 \\ m\#8, & N_t = 4 \end{cases}$$

As discussed above for a single transmit antenna the constellation remapping is $\tilde{d}(i)=d(i)$ for $M_{symb}-1$.

Where there are two transmit antennas the mapping index #17 of TABLE 3 can be viewed by applying a negation operation on the I-part at the output of the modulation step. For the sequence at the output of the modulation step $d(0), \ldots, d(M_{sybm}-1)$, if $d(i)=d_1(i)+jd_Q(i)$ for $i=0, \ldots M_{symb}-1$, are denoted as the real and imaginary parts of d(i), then the output of the constellation remapping step gives a symbol sequence described by $\tilde{d}(i)=-d_1(i)+jd_Q(i)$ for $i=0, \ldots M_{symb}-1$.

Where there are three transmit antennas, the mapping index #8 of TABLE 3 can be viewed by applying a negation operation on the Q-part at the output of the modulation step. For the sequence at the output of the modulation step $d(0), \ldots, d(M_{symb}-1)$, if $d(i)=d_1(i)+jd_Q(i)$ for $i=0, \ldots M_{symb}-1$, and $d_1(i),d_Q(i)$ denote the real and imaginary parts of d(i), then the output of the constellation remapping step gives a symbol sequence described by $\tilde{d}(i)=d_1(i)-jd_Q(i)$ for $i=0, \ldots M_{symb}-1$.

In another embodiment, a mathematical function may be applied to determine the antenna configuration removing the need for TABLE 3. In this embodiment, a mod function may be applied to an index that results in the configuration of the antenna. In this embodiment, the index of the mapping is applied to a modulo function which results in an integer that corresponds with an antenna configuration. For example, for the function $g(N_t,i)$ as (for $i=0, \ldots M_{symb}-1$) the following relationships between antenna configuration and mapping sequences can be determined:

$$g(l, i) = 1,$$

for all i;

$$g(2, i) = \begin{cases} m\#1 & \text{if } \mod(i, 3) = 0 \\ m\#17, & \text{if } \mod(i, 3) = 1; \\ m\#8, & \text{if } \mod(i, 3) = 2 \end{cases} \quad g(4, i) = \begin{cases} m\#1 & \text{if } \mod(i, 3) = 0 \\ m\#8 & \text{if } \mod(i, 3) = 1 \\ m\#17, & \text{if } \mod(i, 3) = 2 \end{cases}$$

The modulo function is applied to the constellation index received by the subscriber station. This removes the need for TABLE 3, as the modulo result corresponds to the antenna configuration.

For the single antenna configuration, the modulo constellation remapping is simply $\tilde{d}(i)=d(i)$ for $i=0, \ldots M_{symb}-1$.

For the two transmit antenna modulo configuration, the length-3 mapping sequence m#1, m#17, m#8 is repeated. For the sequence at the output of the modulation step $d(0), \ldots, d(M_{symb}-1)$, if $d(i)=d_1(i)+jd_Q(i)$ for $i=0, \ldots M_{symb}-1$ denotes the real and imaginary parts of d(i), then the output of the constellation remapping step gives a symbol sequence described by:

$$\tilde{d}(i) = \begin{cases} d_I(i) + jd_Q(i), & \text{if } \mod(i,3) = 0 \\ -d_I(i) + jd_Q(i), & \text{if } \mod(i,3) = 1, \text{ for } i = 0, \ldots M_{symb} - 1. \\ d_I(i) - jd_Q(i), & \text{if } \mod(i,3) = 2 \end{cases}$$

For the four transmit antenna modulo configuration, output of the constellation remapping step gives a symbol sequence described by:

$$\tilde{d}(i) = \begin{cases} d_I(i) + jd_Q(i), & \text{if } \mod(i,3) = 0 \\ d_I(i) - jd_Q(i), & \text{if } \mod(i,3) = 1, \text{ for } i = 0, \ldots M_{symb} - 1. \\ -d_I(i) + jd_Q(i), & \text{if } \mod(i,3) = 2 \end{cases}$$

Figure 7:
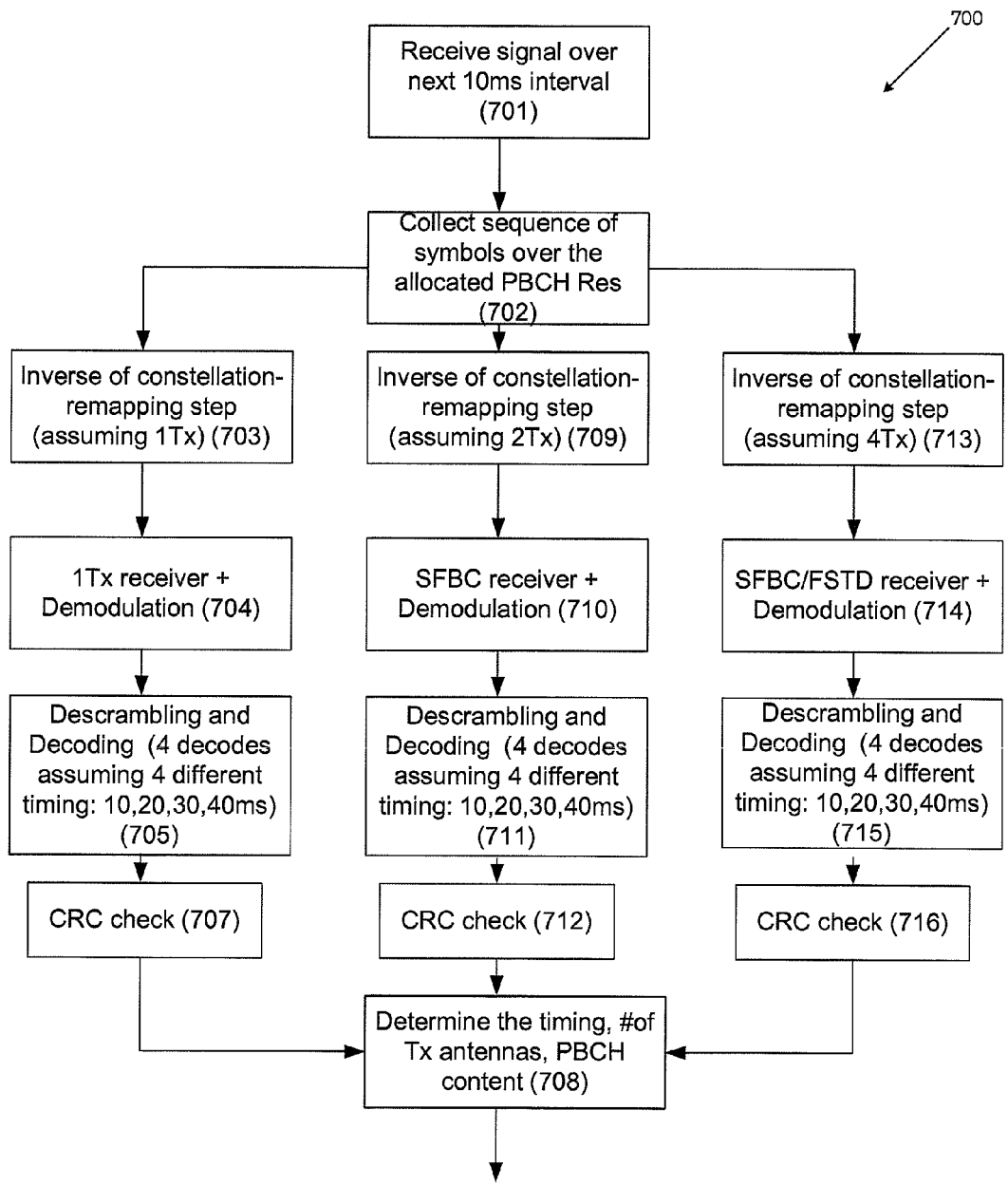
FIG. 7 is a flowchart of the interpretation of signals by a subscriber station according to one embodiment of the present disclosure.

FIG. 7 is a flowchart 700 of the interpretation of signals by a subscriber station received from base stations 101-103. In this flowchart, a signal is received by the subscriber station (Block 701). The subscriber station then collects a sequence of symbols over the allocated PBCH resource (Block 702). At this point, the constellation is interpreted to determine the proper number of antennas. It is understood that in most cases this will be sufficient to determine the antenna configuration. This configuration can be confirmed using the following three assumptions. It is understood that the first assumption chosen will be based upon constellation information, and a second assumption will be used only if the first assumption fails to result in a true CRC check. A "true" CRC check refers to a CRC operation where no error appears, and a "false" CRC check refers to a CRC operation where an error appears.

In the first assumption, there is an inverse constellation remapping step assuming a 1 transmit antenna configuration (Block 703). The output from the remapping step is then demodulated assuming a single transmitter (Block 704). Next, descrambling and decoding are performed on the data (Block 705). Finally, a CRC check is performed on the decoded data. (Block 707). If the CRC check passes, and the data is not corrupt, then the assumption that there is one transmit antenna is confirmed.

In the second assumption, there is an inverse constellation remapping step assuming a two transmit antenna configuration (Block 709). The output from the remapping step is then demodulated assuming two transmitters using an SFBC receiver (Block 710). Next, descrambling and decoding are performed on the data (Block 711). Finally, a CRC check is performed on the decoded data (Block 712). If the CRC check passes, and the data is not corrupt, then the assumption that there are two transmit antennas is confirmed.

In a third assumption, there is an inverse constellation remapping step assuming a four transmit antenna configuration (Block 713). The output from the remapping step is then demodulated assuming four transmitters using an SFBC/FSTD receiver (Block 714). Next, descrambling and decoding are performed on the data (Block 715). Finally, a CRC check is performed on the decoded data (Block 716). If the CRC check passes, and the data is not corrupt, then the assumption that there are four transmit antennas is confirmed.

In each of Blocks 706, 711, and 715 four separate decodes are performed. These decodes are performed at the timings 10, 20, 30, and 40 ms. Therefore, while the configuration of the antennas in the base stations 101-103 can be determined, the timing may not be determined. The time is confirmed by testing the decodes at each timing against the CRC check. When the result of the CRC check is true, the timing and antenna configuration is confirmed.

After one of the assumptions is confirmed, the number of transmit antennas is known (Block 708). This information along with the correct timing is used to interpret the PBCH content. It is understood that the constellation remapping as a function of number of transmit antennas can be applied to other physical channel, and to other modulations such as BPSK, 16QAM and 64QAM, etc.

In another embodiment of the present disclosure, a CRC masking step is added to the PBCH transport block. The resulting transmission chain 800 is shown in FIG. 8. The CRC masking means the CRC bits are masked by a bit sequence that is a function of the number of transmit antennas.

FIG. 8 shows that data is input into the system (Block 801). A CRC mask is applied to the data entering into the system (Block 802). The data is then scrambled (Block 803) and modulated (Block 804). Premapping, as discussed in the previous embodiment, may optionally be added. (Block 805). Finally, the data is placed onto data frames (Block 806).

Figure 9:
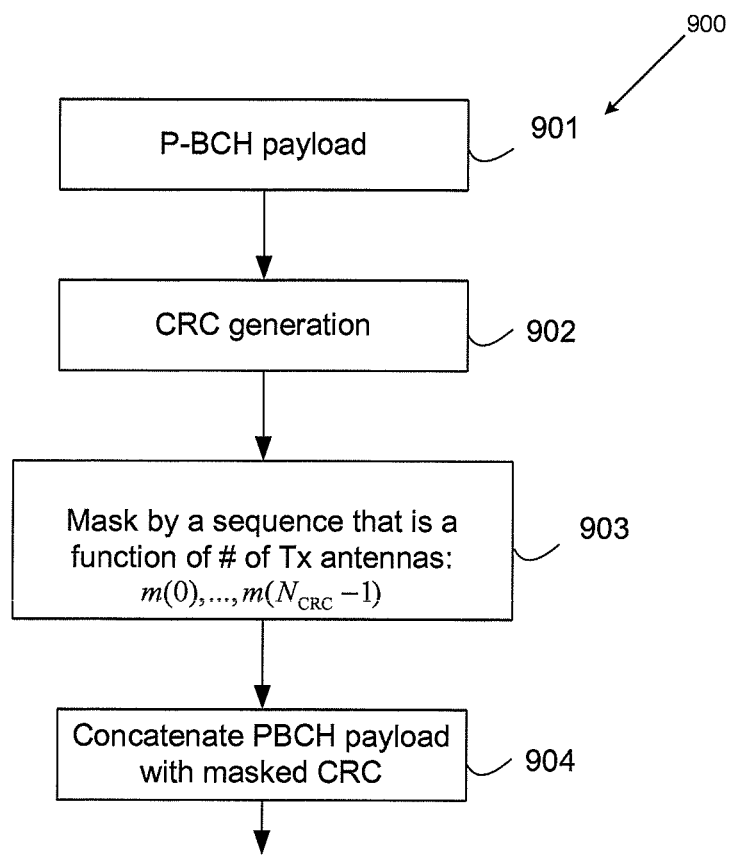
FIG. 9 is a block diagram of CRC masking according to one embodiment of the present disclosure.

FIG. 9 is an example 900 of how the CRC mask may be applied. A P-BCH payload is received for transmission (Block 901). Based on the data, a CRC code is generated (Block 902). This CRC code is then masked by a sequence that is a function of the number of transmit antennas (Block 903).

A CRC check is usually performed on data to ensure the reliability and integrity of the data. There are many ways of calculating a CRC code and implementing a CRC check. For example, a CRC may be a polynomial of $x^4+x+1$. This can be used to check to see that the data is intact. This polynomial can be applied to any data consistent with the CRC-4 standard. Take for instance the following input data:

00000001 (data)

If sent and received over a known communications channel, and this data remains intact. The following function illustrates that the CRC of this data would return a true result.

CRC(000000001)=true

However, according to the present disclosure, the data is masked with another CRC mask. Therefore, the data goes through the following transformation:

00000001 (data)→00000002 (masked data)

Using the old CRC check, the result would be false.

CRC(000000002)=False

The present disclosure uses a plurality of masks to alter data. These masks are then checked against the CRC check to determine which is true. For instance, using the data 000000001, the following masks could be used:

00000001 (data)→00000002 (masked data, one antenna)
00000001 (data)→00000003 (masked data, two antennas)
00000001 (data)→00000004 (masked data, four antennas)

The masked data, when received by the subscriber station, goes through an inverse process of demasking. If the masked data is demasked by the "right" mask, then the CRC check will be true. For instance, 00000003 demasked with the one antenna mask would not equal 00000001, and therefore the CRC check would fail. The 00000003 demasked with the two antenna mask would equal 00000001, and therefore the CRC check would succeed. In this way, the data transmitted to a subscriber station can be masked with information relating to the antenna configuration of the base stations 101-103.

Returning to FIG. 9, the P-BCH is concatenated with the masked CRC (Block 904). In this block, the data is combined with the masked CRC allowing the data to be appropriately interpreted by the subscriber station.

Figure 10:
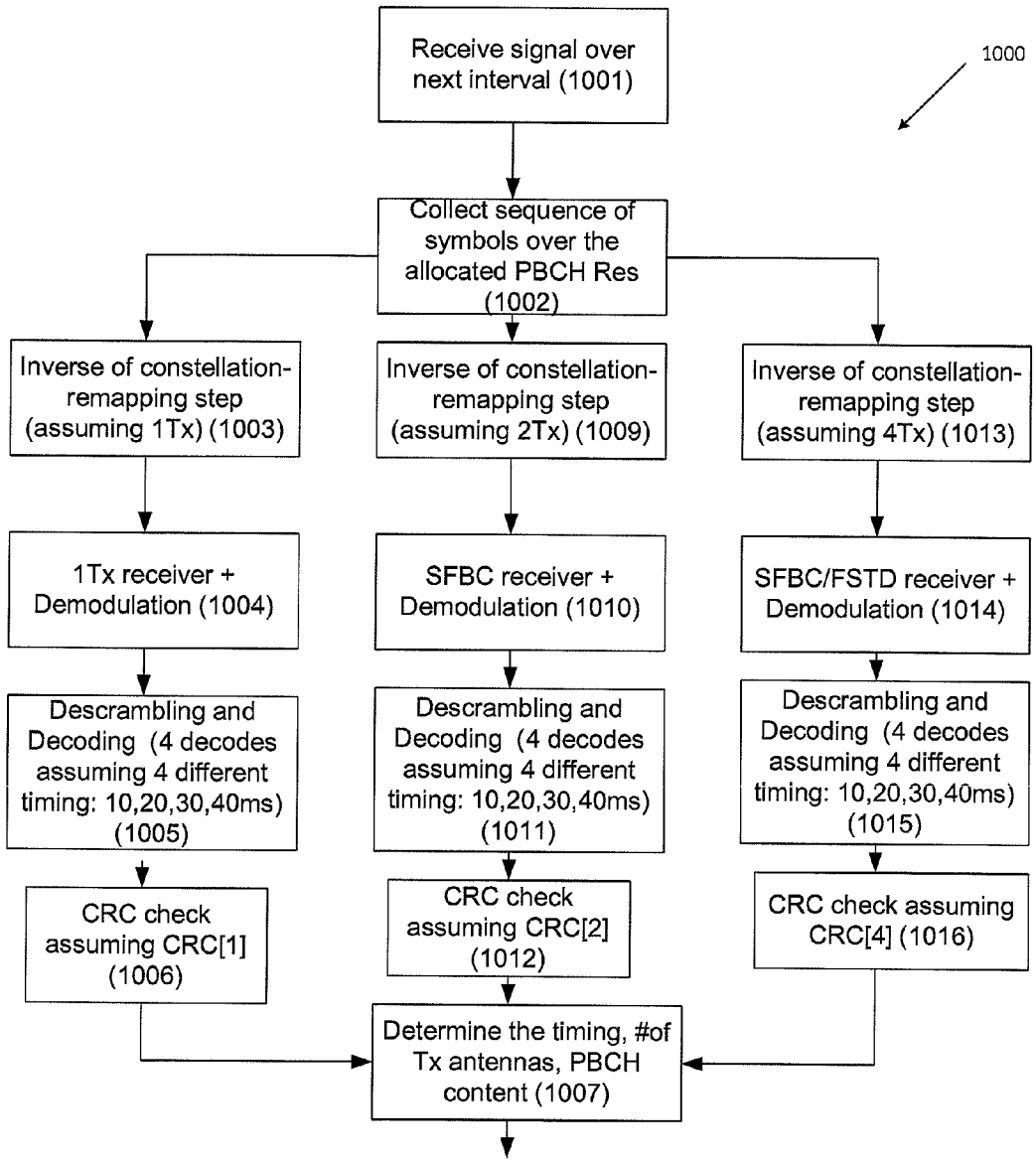
FIG. 10 is a flowchart of the interpretation of signals by a subscriber station according to one embodiment of the present disclosure.

FIG. 10 is a flowchart 1000 of the interpretation of signals by a subscriber station received from base stations 101-103. In this flowchart, a signal is received by the subscriber station (Block 1001). The subscriber station then collects a sequence of symbols over the allocated PBCH resource (Block 1002). At this point, three assumptions are made as to the antenna configuration. One of the three should result in a true result, and the true result will correspond to the correct antenna configuration. Unlike the embodiment that encodes the antenna configuration into the QSPK constellation, the CRC embodiment does not give information directly relating to the antenna configuration. Therefore, unlike the QSPK constellation embodiment, each assumption may be tried.

In a first assumption, a one transmit antenna configuration is assumed (Block 1003). The sequence of symbols is then demodulated assuming a single transmitter (Block 1004). Next, descrambling and decoding are performed on the data (Block 1005). Finally, a CRC check is performed on the decoded data using a first CRC mask. (Block 1006). If the CRC check passes, then the assumption that there is one transmit antenna is confirmed.

In a second assumption, a two transmit antenna configuration is assumed (Block 1009). The sequence of symbols is then demodulated assuming two transmitters using an SFBC receiver (Block 1010). Next, descrambling and decoding are performed on the data (Block 1011). Finally, a CRC check is performed on the decoded data using a second CRC mask (Block 1012). If the CRC check passes, then the assumption that there are two transmit antennas is confirmed.

In a third assumption, there is an inverse constellation remapping step assuming a four transmit antenna configuration (Block 1013). The output from the remapping step is then demodulated assuming four transmitters using an SFBC/FSTD receiver (Block 1014). Next, descrambling and decoding are performed on the data (Block 1015). Finally, a CRC check is performed on the decoded data using a third CRC mask (Block 1016). If the CRC check passes, then the assumption that there are four transmit antennas is confirmed.

In each of Blocks 1005, 1011, and 1015, four separate decodes are performed. These decodes are performed at the timings 10, 20, 30, and 40 ms. Therefore, while there are three assumptions being made about the number of antennas in the base stations 101-103, each one of these configurations may have four timings. Therefore, there are actually twelve tests performed to determine the correct configuration of base stations 101-103.

After one of the assumptions is confirmed, the number of transmit antennas is known. This information along with the correct timing is used to interpret the PBCH content (Block 1007).

Figure 11:
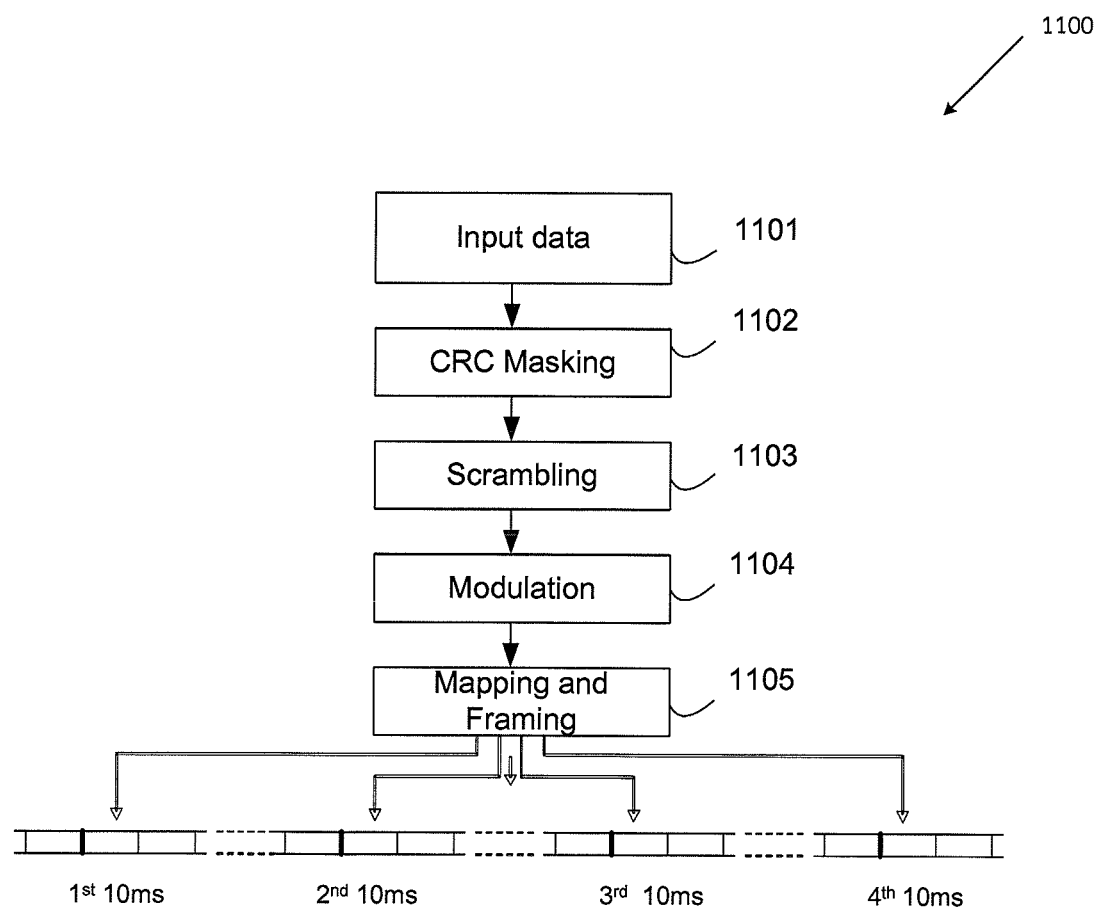
FIG. 11 is a block diagram of the remapping of constellations and CRC mapping according to one embodiment of the present disclosure.

It is understood that both the QPSK constellation and error correcting codes may be used in a single embodiment. FIG. 11 is an embodiment 1100 where both QPSK constellation mapping and CRC masking are used. Data is input into the system (Block 1101). A CRC mask is applied to the data entering into the system (Block 1102). The data is then scrambled (Block 1103) and modulated (Block 1104). The antenna configuration is then mapped onto the QPSK constellation, and the data is placed onto data frames (Block 1105).

Figure 12:
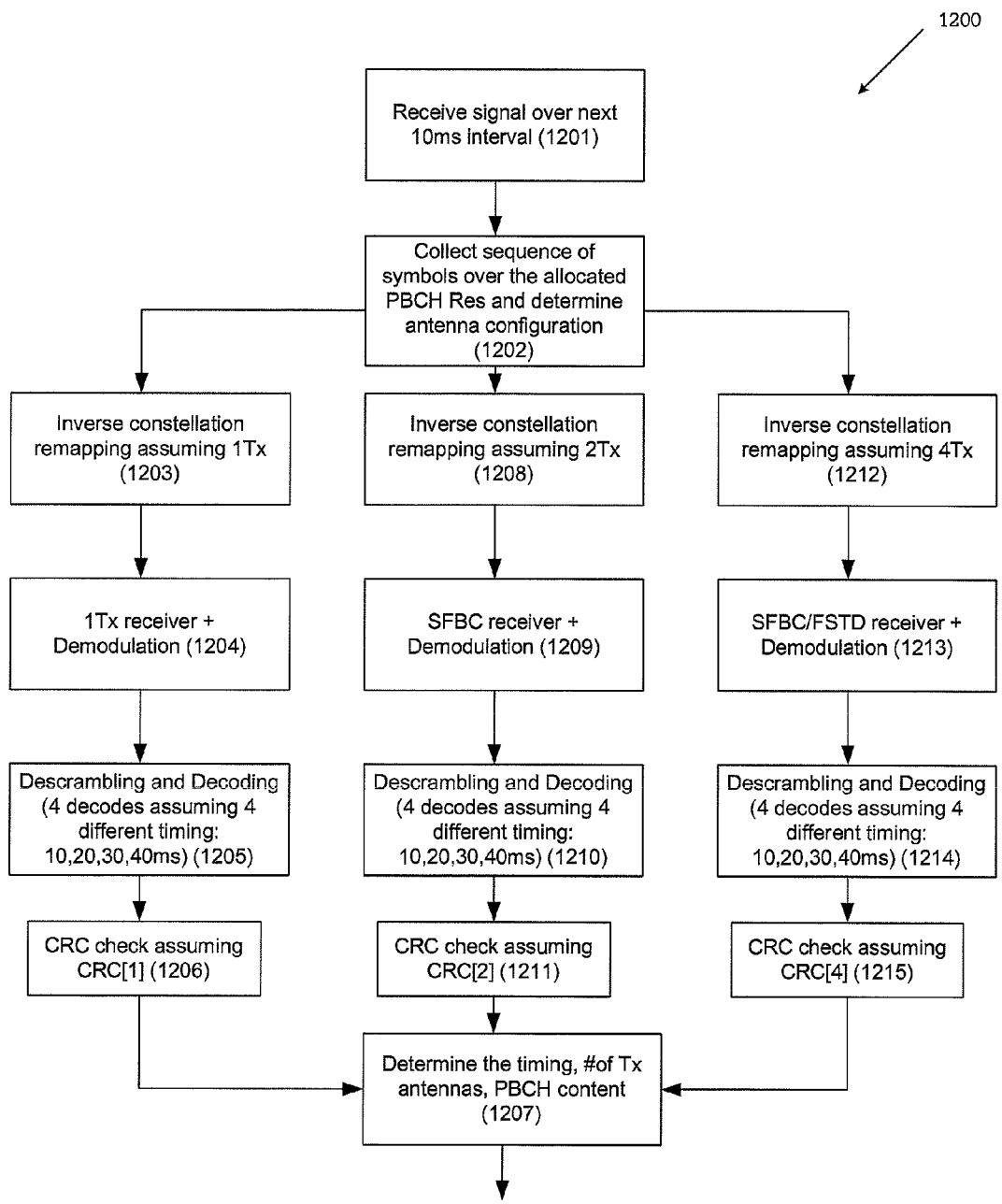
FIG. 12 is a flowchart of the interpretation of signals by a subscriber station using both a QPSK constellation and a CRC mask of the present disclosure.

FIG. 12 is a flowchart 1200 of the interpretation of signals by a subscriber station received from base stations 101-103 using both a QPSK constellation and a CRC mask. In this flowchart, a signal is received by the subscriber station (Block 1201). The subscriber station then collects a sequence of symbols over the allocated PBCH resource (Block 1202). This information is used to determine the antenna configuration of the base stations 101-103 through the QPSK constellation. Three assumptions can be used to confirm the antenna configuration obtained from the QPSK constellation.

In a first assumption, there is an inverse constellation remapping step assuming a 1 transmit antenna configuration (Block 1203). The output from the remapping step is then demodulated assuming a single transmitter (Block 1204). Next, descrambling and decoding are performed on the data (Block 1205). Finally, a CRC check is performed on the decoded data using a first CRC mask (Block 1206). If the CRC check passes, then the assumption that there is one transmit antenna is confirmed.

In a second assumption, there is an inverse constellation remapping step assuming a two transmit antenna configuration (Block 1208). The output from the remapping step is then demodulated assuming two transmitters using an SFBC receiver (Block 1209). Next, descrambling and decoding are performed on the data (Block 1210). Finally, a CRC check is performed on the decoded data using a second CRC mask (Block 1211). If the CRC check passes, then the assumption that there are two transmit antennas is confirmed.

In a third assumption, there is an inverse constellation remapping step assuming a four transmit antenna configuration (Block 1212). The output from the remapping step is then demodulated assuming four transmitters using an SFBC/FSTD receiver (Block 1213). Next, descrambling and decoding are performed on the data (Block 1214). Finally, a CRC check is performed on the decoded data using a third CRC mask (Block 1215). If the CRC check passes, then the assumption that there are four transmit antennas is confirmed.

In each of Blocks 1205, 1210, and 1214, four separate decodes are performed. These decodes are performed at the timings 10, 20, 30, and 40 ms. Therefore, while there are three assumptions being made about the number of antennas in the base stations 101-103, each one of these configurations may have four timings. Therefore, there are actually twelve tests performed to determine the correct configuration of base stations 101-103.

After one of the assumptions is confirmed, the number of transmit antennas is known. This information along with the correct timing is used to interpret the PBCH content (Block 1207).

Through the use of both QPSK constellations and CRC masks, the antenna configuration of the base stations 101-103 can be confirmed.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A base station, comprising:
a processor configured to modify a cyclic redundancy check (CRC) code using a sequence from a plurality of sequences corresponding to a configuration of one or more transmit antenna ports of the base station; and
a transmitter configured to transmit data and the modified CRC code on a broadcast channel.

2. The base station of claim 1, wherein the plurality of sequences is to be used by a subscriber station to determine a configuration of one or more transmit antenna ports of the base station.

3. The base station of claim 1, wherein each of the plurality of sequences is to be applied to the transmitted modified CRC code by the subscriber station to determine the configuration of one or more transmit antenna ports of the base station,
wherein modification of the CRC code with a first sequence indicates the base station is configured to transmit using one antenna port, modification of the CRC code with a second sequence different than the first sequence indicates the base station is configured to transmit using two antenna ports, and modification of the CRC code with a third sequence different from the first and second sequences indicates the base station is configured to transmit using four antenna ports.

4. The base station of claim 1, wherein the broadcast channel is a Physical Broadcast CHannel (PBCH).

5. A method, comprising:
modifying a cyclic redundancy check (CRC) code using a sequence from a plurality of sequences corresponding to a configuration of one or more transmit antenna ports of a base station; and
transmitting data and the modified CRC code on a broadcast channel.

6. The method of claim 5, wherein the plurality of sequences is to be used by a subscriber station to determine a configuration of one or more transmit antenna ports of the base station.

7. The method of claim 5, wherein each of the plurality of sequences is to be applied to the transmitted modified CRC code by the subscriber station to determine the configuration of one or more transmit antenna ports of the base station,
wherein modification of the CRC code with a first sequence indicates the base station is configured to transmit using one antenna port, modification of the CRC code with a second sequence different than the first sequence indicates the base station is configured to transmit using two antenna ports, and modification of the CRC code with a third sequence different from the first and second sequences indicates the base station is configured to transmit using four antenna ports.

8. The method of claim 5, wherein the broadcast channel is a Physical Broadcast CHannel (PBCH).

9. A user equipment, comprising:
a receiver configured to receive data and a modified cyclic redundancy check (CRC) code on a broadcast channel; and
a processor configured to generate a cyclic redundancy check (CRC) code for the received data, to compare the received modified CRC code with the generated CRC code modified using a sequence from a plurality of sequences corresponding to a configuration of one or more transmit antenna ports of a base station, and to determine the configuration of the one or more transmit antenna ports based upon the comparison.

10. The user equipment of claim 9, wherein each of the plurality of sequences is used by the processor to determine the configuration of one or more transmit antenna ports.

11. The user equipment of claim 9, wherein the processor is configured to apply each of the plurality of sequences to the generated CRC code to determine the configuration of one or more transmit antenna ports,
wherein a match between the received modified CRC code and the generated CRC code modified with a first sequence indicates the base station is configured to transmit using one antenna port, a match between the received modified CRC code and the generated CRC code modified with a second sequence different than the first sequence indicates the base station is configured to transmit using two antenna ports, and a match between the received modified CRC code and the generated CRC code modified with a third sequence different from the first and second sequences indicates the base station is configured to transmit using four antenna ports.

12. The user equipment of claim 9 wherein the broadcast channel is a Physical Broadcast CHannel (PBCH).

13. A method, comprising:
receiving data and a modified cyclic redundancy check (CRC) code on a broadcast channel;
generating a cyclic redundancy check (CRC) code for the received data;
comparing the received modified CRC code with the generated CRC code modified using a sequence from a plurality of sequences corresponding to a configuration of one or more transmit antenna ports of a base station; and
determining the configuration of the one or more transmit antenna ports based upon the comparison.

14. The method of claim 13, further comprising:
using each of the plurality of sequences to determine the configuration of one or more transmit antenna ports.

15. The method of claim 13, further comprising:
applying each of the plurality of sequences to the generated CRC code to determine the configuration of one or more transmit antenna ports,
wherein a match between the received modified CRC code and the generated CRC code modified with a first sequence indicates the base station is configured to transmit using one antenna port, a match between the received modified CRC code and the generated CRC code modified with a second sequence different than the first sequence indicates the base station is configured to transmit using two antenna ports, and a match between the received modified CRC code and the generated CRC code modified with a third sequence different from the first and second sequences indicates the base station is configured to transmit using four antenna ports.

16. The method of claim 13, wherein the broadcast channel is a Physical Broadcast CHannel (PBCH).

17. A base station, comprising:
a processor configured to generate a cyclic redundancy check (CRC) code for data to be transmitted on a Physical Broadcast CHannel (PBCH) and to modify the CRC:
with a first sequence when the base station is configured to transmit using one antenna port,
with a second sequence different than the first sequence when the base station is configured to transmit using two antenna ports, and
with a third sequence different from the first and second sequences when the base station is configured to transmit using four antenna ports; and
a transmitter configured to transmit the data and the modified CRC code on the PBCH.

18. The base station of claim 17, wherein the first, second and third sequences are to be used by a subscriber station to determine a configuration of transmit antenna ports of the base station.

19. The base station of claim 17, wherein each of the first, second and third sequences is to be applied to the transmitted modified CRC code by the subscriber station to determine the configuration of transmit antenna ports of the base station.

20. A method of transmitting data, comprising:
generating, in a base station, a cyclic redundancy check (CRC) code for data to be transmitted on a Physical Broadcast CHannel (PBCH);
modifying, in the base station, the CRC:
with a first sequence when the base station is configured to transmit using one antenna port,
with a second sequence different than the first sequence when the base station is configured to transmit using two antenna ports, and with a third sequence different from the first and second sequences when the base station is configured to transmit using four antenna ports; and transmitting, from the base station, the data and the modified CRC code on the PBCH.

21. The method of claim 20, wherein the first, second and third sequences are to be used by a subscriber station to determine a configuration of transmit antenna ports of the base station.

22. The method of claim 20, wherein each of the first, second and third sequences is to be applied to the transmitted modified CRC code by the subscriber station to determine the configuration of transmit antenna ports of the base station.

23. A user equipment, comprising:
- a receiver configured to receive, on a Physical Broadcast CHannel (PBCH), data and a modified cyclic redundancy check (CRC) code generated on the data; and
- a processor configured to generate a CRC check code for the received data, to modify the generated CRC check code with each of first, second and third sequences to generate first, second and third modified CRC check codes, to compare the first, second and third modified CRC check codes to the received modified CRC code, and to determine that the data and the modified CRC code were transmitted:
  - using one antenna port when the first modified CRC check code matches the received modified CRC code,
  - using two antenna ports when the second modified CRC check code matches the received modified CRC code, and
  - using four antenna ports when the third modified CRC check code matches the received modified CRC code.

24. The user equipment of claim 23, wherein the first, second and third modified CRC check codes are generated concurrently.

25. The user equipment of claim 23, wherein the processor is configured to concurrently demodulate the received data as if transmitted using one antenna port, as if transmitted using two antenna ports, and as if transmitted using four antenna ports.

26. A method of receiving data at a user equipment, comprising:
- receiving, at the user equipment on a Physical Broadcast CHannel (PBCH), data and a modified cyclic redundancy check (CRC) code generated on the data; and
- generating, in the user equipment, a CRC check code for the received data;
- modifying, in the user equipment, the generated CRC check code with each of first, second and third sequences to generate first, second and third modified CRC check codes;
- comparing, in the user equipment, the first, second and third modified CRC check codes to the received modified CRC code; and
- determining, in the user equipment, that the data and the modified CRC code were transmitted:
  - using one antenna port when the first modified CRC check code matches the received modified CRC code,
  - using two antenna ports when the second modified CRC check code matches the received modified CRC code, and
  - using four antenna ports when the third modified CRC check code matches the received modified CRC code.

27. The method of claim 26, wherein the first, second and third modified CRC check codes are generated concurrently.

28. The method of claim 26, further comprising:
- concurrently demodulating the received data as if transmitted using one antenna port, as if transmitted using two antenna ports, and as if transmitted using four antenna ports.

* * * * *